(12) United States Patent
Saitoh et al.

(10) Patent No.: US 10,535,692 B2
(45) Date of Patent: Jan. 14, 2020

(54) IMAGING PANEL AND X-RAY IMAGING DEVICE INCLUDING SAME

(71) Applicant: SHARP KABUSHIKI KAISHA, Sakai, Osaka (JP)

(72) Inventors: Takao Saitoh, Sakai (JP); Yutaka Takamaru, Sakai (JP); Yohsuke Kanzaki, Sakai (JP); Seiji Kaneko, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 118 days.

(21) Appl. No.: 15/566,464

(22) PCT Filed: Apr. 7, 2016

(86) PCT No.: PCT/JP2016/061421
§ 371 (c)(1),
(2) Date: Oct. 13, 2017

(87) PCT Pub. No.: WO2016/167179
PCT Pub. Date: Oct. 20, 2016

(65) Prior Publication Data
US 2018/0122842 A1 May 3, 2018

(30) Foreign Application Priority Data

Apr. 13, 2015 (JP) .................. 2015-081809

(51) Int. Cl.
*H01L 27/146* (2006.01)
*G01T 1/20* (2006.01)
(Continued)

(52) U.S. Cl.
CPC ............ *H01L 27/1462* (2013.01); *G01T 1/20* (2013.01); *H01L 27/1225* (2013.01);
(Continued)

(58) Field of Classification Search
CPC ............. H01L 27/1462; H01L 27/1225; H01L 27/1248; H01L 27/14663; H01L 27/14685;
(Continued)

(56) References Cited

U.S. PATENT DOCUMENTS

2005/0258425 A1* 11/2005 Izumi ................ H01L 27/14665
257/72
2005/0269516 A1* 12/2005 Mochizuki ............ G01T 1/2928
250/370.11
(Continued)

FOREIGN PATENT DOCUMENTS

JP     2011-114229 A    6/2011
JP     2011-176274 A    9/2011
(Continued)

*Primary Examiner* — Taeho Jo
(74) *Attorney, Agent, or Firm* — ScienBiziP, P.C.

(57) ABSTRACT

An imaging panel having a plurality of pixels, for picking up scintillation light obtained by converting X-ray projected from an X-ray source, with use of a scintillator, includes photodiodes, TFTs, and an organic film. The photodiodes are provided at the pixels, respectively, for receiving the scintillation light and converting the same into charges. The TFTs are provided at the pixels, respectively, for reading the charges obtained through the conversion by the photodiodes. In one pixel area of the pixels, an area where the organic film is not provided exists in a layer at an upper position with respect to the TFTs, other than an area where a contact hole CH1 for connecting the photodiode and the drain electrode is provided.

3 Claims, 12 Drawing Sheets

(51) Int. Cl.
*H01L 27/12* (2006.01)
*H01L 29/786* (2006.01)
*H01L 31/105* (2006.01)

(52) U.S. Cl.
CPC .. *H01L 27/14663* (2013.01); *H01L 27/14685* (2013.01); *H01L 27/14692* (2013.01); *H01L 29/7869* (2013.01); *H01L 31/1055* (2013.01)

(58) Field of Classification Search
CPC ........... H01L 27/14692; H01L 29/7869; H01L 31/1055; G01T 1/20
USPC .......................................................... 378/62
See application file for complete search history.

(56) References Cited

U.S. PATENT DOCUMENTS

| | | | | |
|---|---|---|---|---|
| 2007/0114625 A1* | 5/2007 | Hsiao | ................ | H01L 27/14609 257/431 |
| 2008/0302969 A1* | 12/2008 | Jung | ................ | H01L 27/12 250/370.09 |
| 2009/0032892 A1* | 2/2009 | Hsiao | ................ | H01L 27/14609 257/431 |
| 2009/0250699 A1* | 10/2009 | Okada | ................ | H01L 27/14663 257/53 |
| 2009/0283689 A1* | 11/2009 | Mochizuki | ........ | H01L 27/14663 250/370.14 |
| 2011/0127439 A1* | 6/2011 | Imai | ................ | H01L 27/307 250/370.08 |
| 2011/0180716 A1* | 7/2011 | Okada | ................ | G01T 1/243 250/370.08 |
| 2012/0153170 A1* | 6/2012 | Nariyuki | ................ | G01T 1/2018 250/368 |
| 2012/0187464 A1* | 7/2012 | Okada | ............... | H01L 27/14603 257/292 |
| 2014/0103347 A1* | 4/2014 | Ishino | ................ | H01L 27/14692 257/59 |
| 2014/0131696 A1* | 5/2014 | Ono | ................ | H01L 29/7869 257/40 |
| 2015/0249197 A1* | 9/2015 | Shieh | ................ | H01L 33/642 257/72 |
| 2016/0041444 A1* | 2/2016 | Yokoi | ................ | G02F 1/13458 257/773 |
| 2017/0236855 A1* | 8/2017 | Tomiyasu | ........... | H01L 21/8234 378/91 |

FOREIGN PATENT DOCUMENTS

| | | | |
|---|---|---|---|
| JP | 2013-030682 A | | 2/2013 |
| JP | 2013-157347 A | | 8/2013 |
| JP | 2013157347 A | * | 8/2013 |
| JP | 2014-078651 A | | 5/2014 |
| WO | 2009/139209 A1 | | 11/2009 |

* cited by examiner

IMAGING PANEL AND X-RAY IMAGING DEVICE INCLUDING SAME

TECHNICAL FIELD

The present invention relates to an imaging panel and an X-ray imaging device including the same.

BACKGROUND ART

An X-ray imaging device has been known that picks up an X-ray image by using an imaging panel that includes a plurality of pixel portions. Patent Document 1 shown below discloses an X-ray sensor in which each pixel includes a thin film transistor (TFT) made of an oxide semiconductor, and a photodiode.

PRIOR ART DOCUMENT

Patent Document

Patent Document 1: JP-A-2013-30682

SUMMARY OF THE INVENTION

Problem to be Solved by the Invention

In the X-ray sensor disclosed in Patent Document 1, a passivation film is provided on an oxide semiconductor layer that composes a thin film transistor, and an insulating film is provided under the oxide semiconductor layer. In a case where silicon dioxide ($SiO_2$) is used in the passivation film or the insulating film, a defect levels is formed when these films are irradiated with X-ray. When charges are captured by the defect level, the threshold voltage of the thin film transistor shifts, which makes it unable to cause the thin film transistor to stably operate.

It is an object of the present invention to provide an imaging panel and an X-ray imaging device in which a shift of the threshold voltage of a thin film transistor during X-ray irradiation can be suppressed.

Means to Solve the Problem

An imaging panel according to one embodiment of the present invention is an imaging panel having a plurality of pixels, for picking up scintillation light obtained by converting X-ray projected from an X-ray source, with use of a scintillator. The imaging panel includes: conversion elements that are provided at the pixels, respectively, for receiving the scintillation light and converting the same into charges; thin film transistors that are provided at the pixels, respectively, for reading the charges obtained through the conversion by the conversion elements; and an organic film provided at an upper or lower position with respect to the conversion elements. In the imaging panel, each thin film transistor includes: an oxide semiconductor layer; a gate terminal; a source terminal formed on a part of the oxide semiconductor layer; and a drain terminal formed on a part of the oxide semiconductor layer. In one pixel area of the pixels, an area where the organic film does not exist exists in a layer at an upper position with respect to the thin film transistors, other than an area where a contact hole for connecting the conversion element and the drain terminal is provided.

Effect of the Invention

With the present invention, a shift of a threshold voltage of a thin film transistor can be suppressed, whereby the thin film transistor can be caused to stably operate.

MODE FOR CARRYING OUT THE INVENTION

Figure 1:
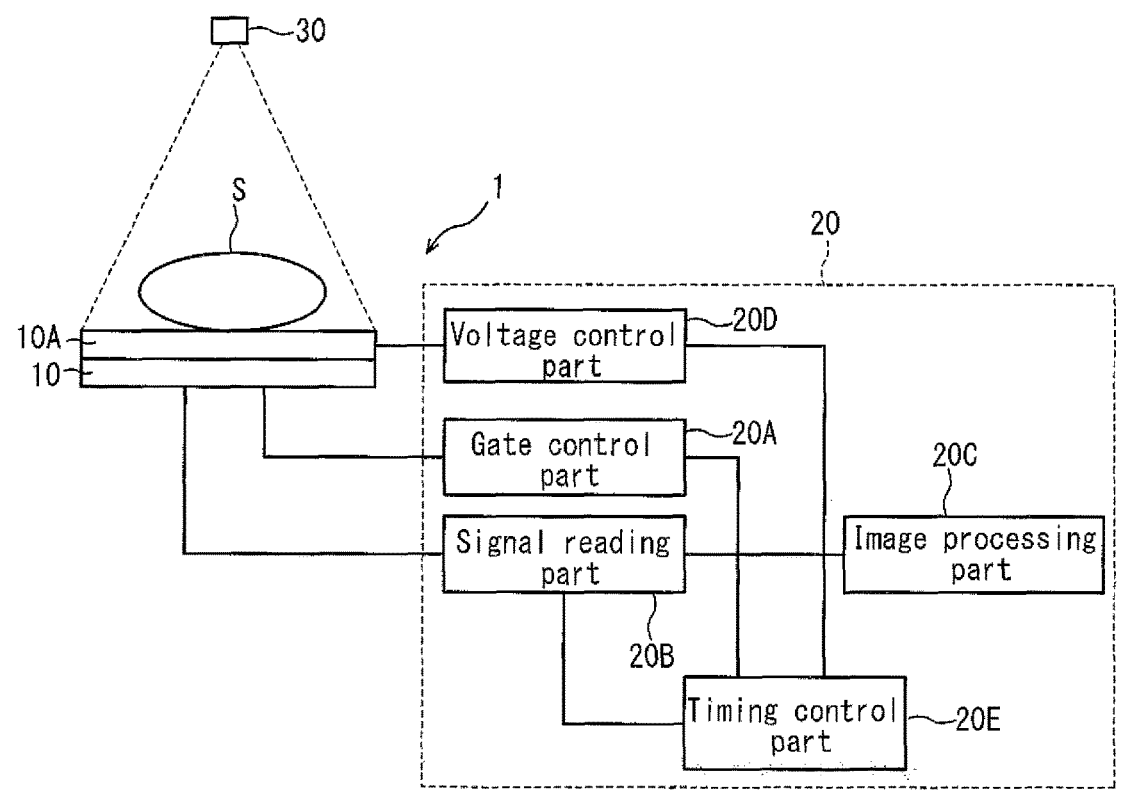
FIG. 1 is a schematic diagram illustrating an X-ray imaging device in Embodiment 1.

An imaging panel according to one embodiment of the present invention is an imaging panel having a plurality of pixels, for picking up scintillation light obtained by converting X-ray projected from an X-ray source, with use of a scintillator. The imaging panel includes: conversion elements that are provided at the pixels, respectively, for receiving the scintillation light and converting the same into charges; thin film transistors that are provided at the pixels, respectively, for reading the charges obtained through the conversion by the conversion elements; and an organic film provided at an upper or lower position with respect to the conversion elements. In the imaging panel, each thin film transistor includes: an oxide semiconductor layer; a gate terminal; a source terminal formed on a part of the oxide semiconductor layer; and a drain terminal formed on a part of the oxide semiconductor layer. In one pixel area of the pixels, an area where the organic film does not exist exists in a layer at an upper position with respect to the thin film transistors, other than an area where a contact hole for connecting the conversion element and the drain terminal is provided (the first configuration).

According to the first configuration, an area where an organic film does not exist exists in a layer at an upper position with respect to the thin film transistor. With this configuration, water or hydrogen in the organic film can be released through this area. With this configuration, even if a defect level is formed in, for example, an interlayer insulating film existing on the oxide semiconductor layer or a gate insulating film existing under the oxide semiconductor layer during the X-ray irradiation, positive charges of water or hydrogen in the organic film can be prevented from being captured by the defect level. This makes it possible to decrease the amount of shift of the threshold voltage of the thin film transistor by the X-ray irradiation.

The first configuration may be further characterized in that the organic film does not exist above the thin film transistors (the second configuration).

According to the second configuration, an organic film does not exist above the thin film transistor. With this configuration, in a case where a defect level is formed in, for example, the interlayer insulating film existing on the oxide semiconductor layer or the gate insulating film existing under the oxide semiconductor layer during the X-ray irradiation, positive charges of water or hydrogen in the organic film can be more effectively prevented from being captured by the defect level. This makes it possible to decrease the amount of shift of the threshold voltage of the thin film transistor by the X-ray irradiation.

The first configuration may be further characterized in that the organic film includes a first organic film, and a second organic film that is provided at an upper position with respect to the first organic film, and in one pixel area of the pixels, an area where at least one of the first organic film and the second organic film does not exist exists in a layer at an upper position with respect to the thin film transistors, other than the area where the contact hole is provided (the third configuration).

With the third configuration, even if the configuration includes two layers of organic films, the amount of shift of the threshold voltage of the thin film transistor by the X-ray irradiation can be decreased.

The third configuration may be further characterized in that at least one of the first organic film and the second organic film does not exist above the thin film transistors (the fourth configuration).

With the fourth configuration, the amount of shift of the threshold voltage of the thin film transistor caused by the X-ray irradiation can be decreased more effectively in the configuration including two layers of organic films.

An X-ray imaging device includes the imaging panel of any one of the first to fourth configurations; an X-ray source that projects X-ray; and a control unit that reads out a signal corresponding to charges obtained through conversion by the conversion elements by controlling a gate voltage of the thin film transistors (the fifth configuration).

With the fifth configuration, an X-ray imaging device in which the amount of shift of the threshold voltage of the thin film transistor by the X-ray irradiation is decreased can be provided.

[Embodiment]

The following description describes embodiments of the present invention in detail, while referring to the drawings. Identical or equivalent parts in the drawings are denoted by the same reference numerals, and the descriptions of the same are not repeated. To make the description easy to understand, in the drawings referred to hereinafter, the configurations are simply illustrated or schematically illustrated, or the illustration of part of constituent members is omitted. Further, the dimension ratios of the constituent members illustrated in the drawings do not necessarily indicate the real dimension ratios.

[Embodiment 1]

FIG. 1 is a schematic diagram illustrating an X-ray imaging device in Embodiment 1. The X-ray imaging device 1 includes an imaging panel 10, a scintillator 10A, a control unit 20, and an X-ray source 30. X-ray is projected from the X-ray source 30 to a subject S, and X-ray having passed through the subject S is converted into fluorescence (hereinafter referred to as scintillation light) by the scintillator 10A arranged over the imaging panel 10. The X-ray imaging device 1 obtains an X-ray image by picking up the scintillation light with use of the imaging panel 10 and the control unit 20.

Figure 2:
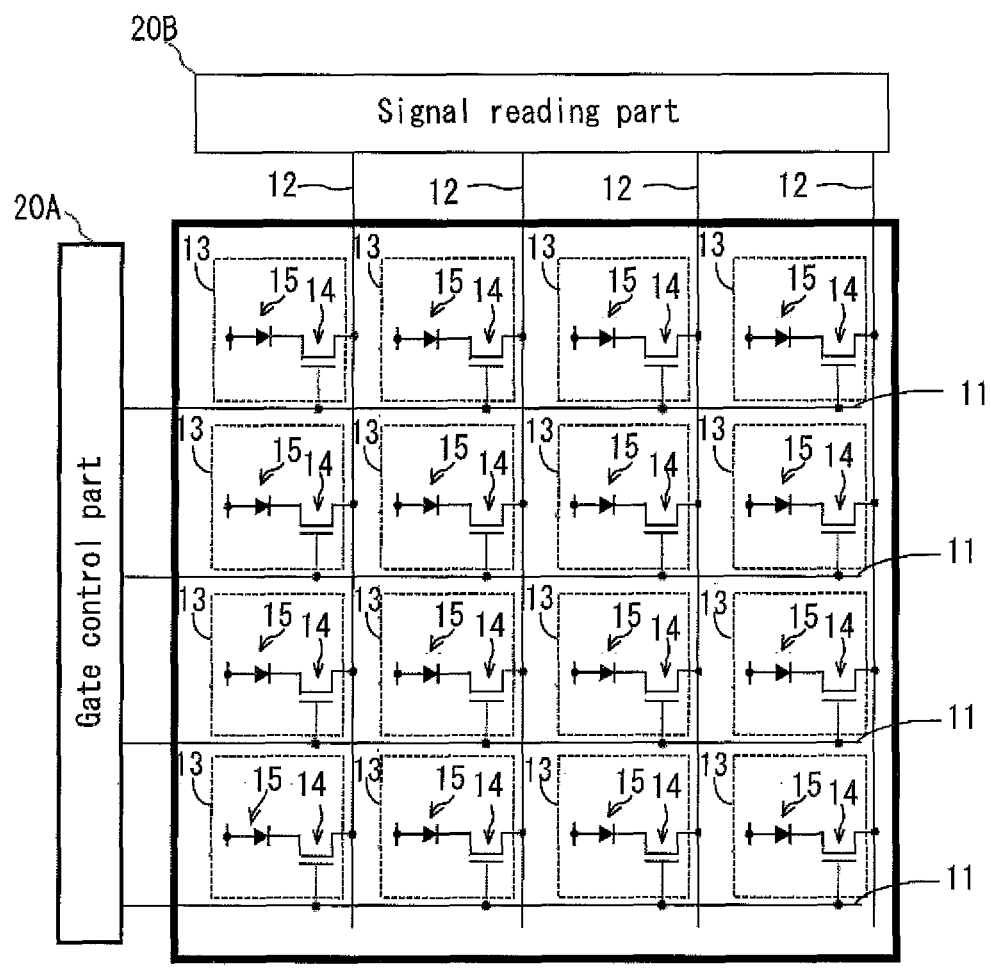
FIG. 2 is a schematic diagram illustrating a schematic configuration of the imaging panel.

FIG. 2 is a schematic diagram illustrating a schematic configuration of the imaging panel 10. As illustrated in FIG. 2, a plurality of gate lines 11 and a plurality of data lines 12 that intersect with the gate lines 11 are formed in the imaging panel 10. The imaging panel 10 includes a plurality of areas 13 that are defined by the gate lines 11 and the data line 12 (these areas are hereinafter referred to as pixels). FIG. 2 illustrates an example in which sixteen (4×4) pixels 13 are provided, but the number of pixels in the imaging panel 10 is not limited to this.

Each pixel 13 is provided with a thin film transistor (TFT) 14 connected to the gate line 11 and the data line 12, and a photodiode 15 connected to the TFT 14. Further, though the illustration is omitted in FIG. 2, each pixel 13 is provided with a bias line 16 (see FIG. 3) for supplying a bias voltage to the photodiode 15, in such a form that the bias line 16 is approximately parallel to the data line 12.

In each pixel 13, scintillation light obtained by converting X-ray having passed through the subject S is converted by the photodiode 15 into charges in accordance with the amount of the light.

The gate lines 11 in the imaging panel 10 are switched sequentially to a selected state one by one by a gate control part 20A, and the TFTs 14 connected to the gate line 11 in the selected state are turned ON. When the TFTs 14 shift to the ON state, data signals corresponding to charges obtained by conversion by the photodiode 15 are output via the data lines 12 to a signal reading part 20B.

Figure 3:
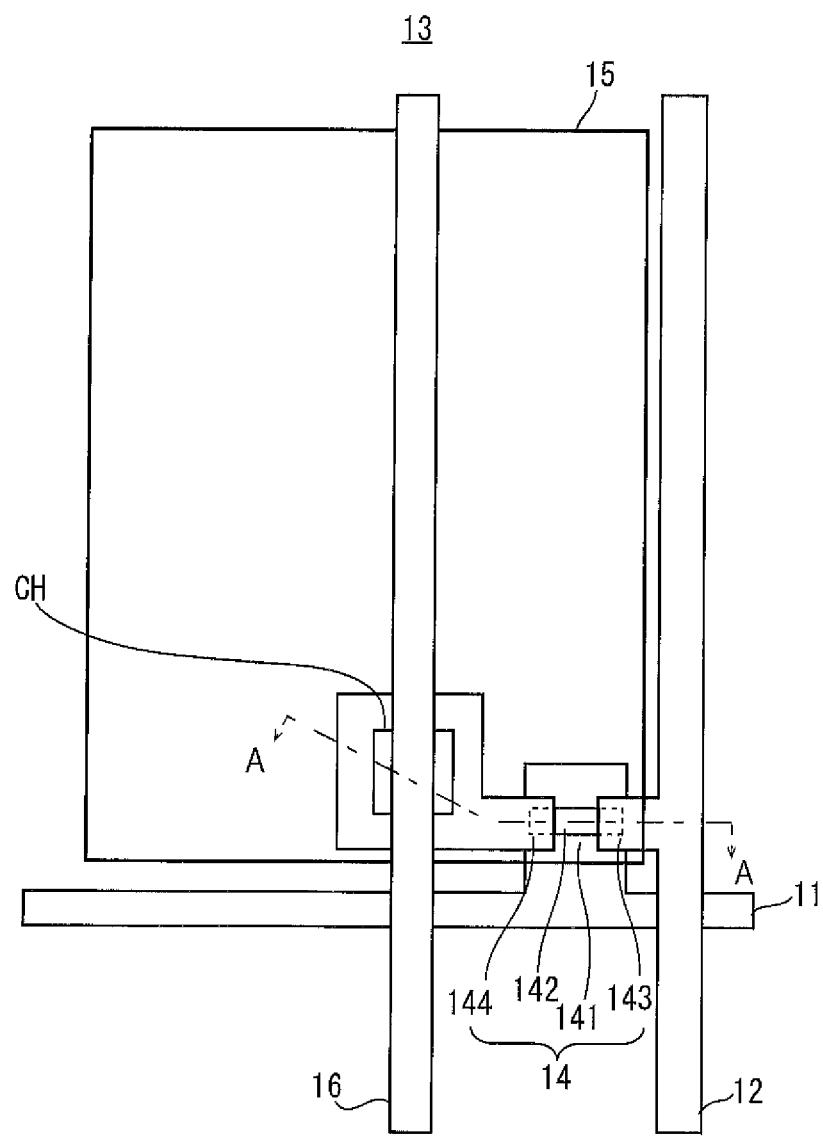
FIG. 3 is a plan view illustrating a pixel of the imaging panel illustrated in FIG. 2.

Next, the following description describes a specific configuration of the pixel 13. FIG. 3 is a plan view illustrating the pixel 13 of the imaging panel 10 illustrated in FIG. 2. Further, FIG. 4 is a cross-sectional view of the pixel illustrated in FIG. 3 taken along line A-A.

Figure 4:
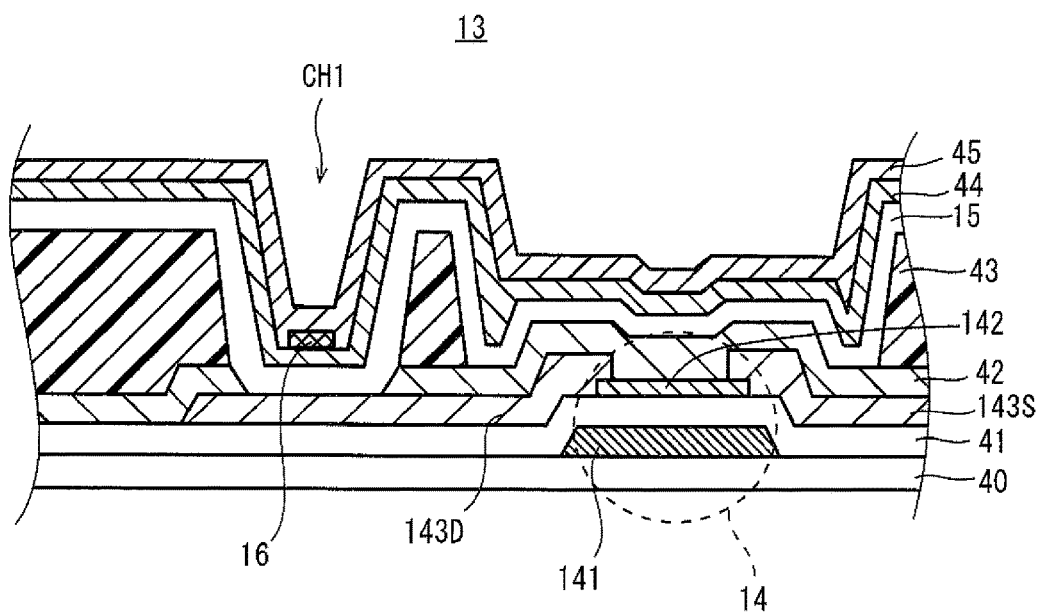
FIG. 4 is a cross-sectional view illustrating the pixel illustrated in FIG. 2 taken along line A-A.

As illustrated in FIG. 4, the pixel 13 is formed on a substrate 40. The substrate 13 is, for example, a substrate having insulating properties, such as a glass substrate, a silicon substrate, a plastic substrate having heat-resisting properties, or a resin substrate. In particular, polyethylene terephthalate (PET), polyethylene naphthalate (PEN), polyether sulfone (PES), acryl, polyimide, or the like may be used for a plastic substrate or a resin substrate.

The TFT 14 includes a gate electrode 141, an oxide semiconductor layer 142 arranged on the gate electrode 141 with a gate insulating film 41 being interposed therebetween, and a source electrode 143S as well as a drain electrode 143D connected to the oxide semiconductor layer 142.

The gate electrode 141 is composed of a branch of the gate line 11 that is branched in a direction in which the data line 12 extends, as illustrated in FIG. 3, and is formed in contact with a surface of the substrate 40, the surface being one of the surfaces in the thickness direction, as illustrated in FIG. 4. The gate electrode 141 is made of, for example, a metal such as aluminum (Al), tungsten (W), molybdenum (Mo), tantalum (Ta), chromium (Cr), titanium (Ti), or copper (Cu), an alloy of any of these metals, or a nitride of any of these metals. Further, the gate electrode 141 may be, for example, a laminate of a plurality of metal films.

As illustrated in FIG. 4, the gate insulating film 41 is formed on the substrate 40, covering the gate electrode 141. To form the gate insulating film 41, for example, silicon oxide ($SiO_x$), silicon nitride ($SiN_x$), silicon oxide nitride ($SiO_xN_y$) (x>y), silicon nitride oxide ($SiN_xO_y$) (x>y), or the like, may be used.

In order to prevent diffusion of impurities and the like from the substrate 40, the gate insulating film 41 may have a laminate structure. For example, silicon nitride ($SiN_x$), silicon nitride oxide ($SiN_xO_y$) (x>y), or the like may be used in a lower layer; and silicon oxide ($SiO_x$), silicon oxide nitride ($SiO_xN_y$) (x>y), or the like may be used in an upper layer. Further, in order that a fine gate insulating film that allows a smaller gate leakage current is formed at a low film forming temperature, a noble gas element such as argon may be contained in a reaction gas so as to be included in the insulating film.

As illustrated in FIG. 4, the oxide semiconductor layer 142 is formed in contact with the gate insulating film 41. The oxide semiconductor layer 142 contains an oxide semiconductor that contains indium (In), gallium (Ga), and zinc (Zn) at a predetermined ratio.

The source electrode 143S and the drain electrode 143D are formed in contact with the oxide semiconductor layer 142 and the gate insulating film 41. As illustrated in FIG. 3, the source electrode 143S is composed of a branch of the data line 12 that is branched in a direction in which the gate line 11 extends. As illustrated in FIG. 4, the drain electrode 143D is connected to the photodiode 15 through the contact hole CH1. The drain electrode 143D functions as a drain electrode of the TFT 14, and also functions as a lower electrode of the photodiode 15.

The source electrode 143S, the data line 12, and the drain electrode 143D are formed in an identical layer. The source electrode 143S, the data line 12, and the drain electrode 143D are made of, for example, a metal such as aluminum (Al), tungsten (W), molybdenum (Mo), tantalum (Ta), chromium (Cr), titanium (Ti), copper (Cu) or the like, or an alloy of any of these, or nitride of any of these metals. Further, as a material for the source electrode 143S, the data line 12, and the drain electrode 143D, the following may be used: a material having translucency such as indium tin oxide (ITO), indium zinc oxide (IZO), indium tin oxide (ITSO) containing silicon oxide, indium oxide ($In_2O_3$), tin oxide ($SnO_2$), zinc oxide (ZnO), or titanium nitride; or an appropriate combination of any of these. The source electrode 143S, the data line 12, and the drain electrode 143D may be obtained by, for example, laminating a plurality of metal films.

As illustrated in FIG. 4, the interlayer insulating film 42 covers the oxide semiconductor layer 142, the source electrode 143S, the data line 12, and the drain electrode 143D. The interlayer insulating film 42 may have a single layer structure made of silicon oxide ($SiO_2$) or silicon nitride (SiN), or a laminate structure obtained by laminating silicon nitride (SiN) and silicon oxide ($SiO_2$) in this order. In the present embodiment, the interlayer insulating film 42 has a film thickness of, for example, about 0.5 μm.

The organic film 43 is formed on the interlayer insulating film 42, and covers the interlayer insulating film 42. In the present embodiment, however, for reasons described below, the organic film 43 does not exist above the TFT 14, more specifically, above the gate electrode 141. In the present embodiment, the configuration is such that the organic film 43 does not exist in an area wider than the area where the TFT 14 is provided, but the configuration may be such that the organic film 43 does not exist in an area of the same size as the area where the TFT 14 is provided.

The organic film is a film made of a high molecular weight organic compound. In the present embodiment, as a material for the organic film 43, for example, an organic resin of polyimide or the like is used. The organic film 43 has a function as a flattening film for flattening the surface.

The photodiode 15 covers the organic film 43 in an area where the organic film 43 is formed, and covers the interlayer insulating film 42 in an area where the organic film 43 is not formed. The photodiode 15 is formed in contact with the drain electrode 143D via the contact hole CH1 that passes through the organic film 43 and the interlayer insulating film 42. The photodiode 15 includes an n-type amorphous silicon layer, an intrinsic amorphous silicon layer, and a p-type amorphous silicon layer (neither illustrated). The n-type amorphous silicon layer is made of amorphous silicon in which an n-type impurity (for example, phosphorus) is doped. The n-type amorphous silicon layer is formed in contact with the drain electrode 143D. The n-type amorphous silicon layer has a thickness of, for example, 20 to 100 nm. The intrinsic amorphous silicon layer is made of intrinsic amorphous silicon. The intrinsic amorphous silicon layer is formed in contact with the n-type amorphous silicon layer. The intrinsic amorphous silicon layer has a thickness of, for example, 200 to 2000 nm. The p-type amorphous silicon layer is made of amorphous silicon in which p-type an impurity (for example, boron) is doped. The p-type amorphous silicon layer is formed in contact with the intrinsic amorphous silicon layer. The p-type amorphous silicon layer has a thickness of, for example, 10 to 50 nm.

The electrode 44 is formed on the photodiode 15, and functions as an upper electrode of the photodiode 15. The electrode 44 supplies the voltage of the bias line 16 described below as a reference voltage (bias voltage) in the photoelectric conversion, to the photodiode 15. As a material for forming the electrode 44, for example, a transparent conductive film of indium tin oxide (ITO), indium zinc oxide (IZO), or the like can be used.

As illustrated in FIGS. 3 and 4, the bias line 16 is formed on the electrode 44, so as to be approximately in parallel to the data line 12. The bias line 16 is connected to a voltage control part 20D (see FIG. 1). The bias line 16 applies a bias voltage supplied from the voltage control part 20D to the electrode 44. The bias line 16 has a laminate structure obtained by laminating, for example, indium zinc oxide (IZO) and molybdenum (Mo).

The protection film 45 is formed on the electrode 44 so as to cover the bias line 16. The protection film 45 may have a single layer structure made of silicon oxide ($SiO_2$) or silicon nitride (SiN), or alternatively, may have a laminate structure obtained by laminating silicon nitride (SiN) and silicon oxide ($SiO_2$) in this order.

Though the illustration is omitted in FIGS. 3 and 4, a scintillator 10A (see FIG. 1) is provided on the imaging panel 10, that is, on the protection film 45.

The following description describes the reason why the organic film 43 is not provided above the TFT 14.

It has been clarified that, during the X-ray irradiation, defect levels are formed in the interlayer insulating film 42 provided on the oxide semiconductor layer 142, and in the gate insulating film 41 provided under the oxide semiconductor layer 142, and charges are captured therein, whereby the threshold voltage of the TFT 14 shifts. This is considered to result from positive charges in the organic film 43, being captured in the defect levels formed in the interlayer insulating film 42 and the gate insulating film 41 during the X-ray irradiation. In the present embodiment, therefore, the organic film 43 is not provided above the TFT 14, so that the shift of the threshold voltage of the TFT 14 caused by the X-ray irradiation is suppressed.

Figure 5A:
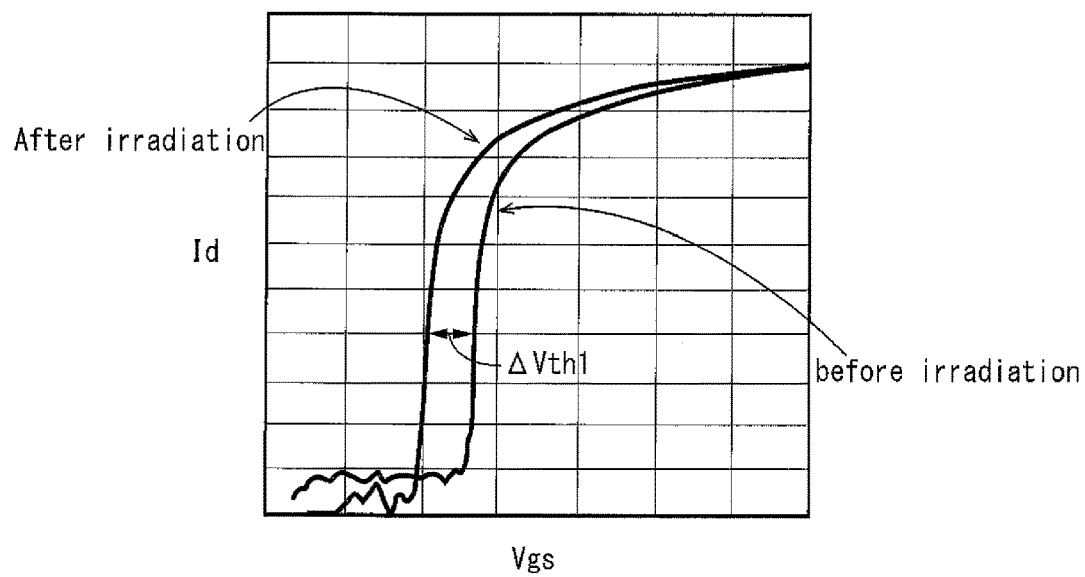
FIG. 5A illustrates the relationship between the gate-source voltage Vgs and the drain current Id before X-ray irradiation, and that after X-ray irradiation, in a configuration in which an organic film does not exist above a TFT.
Figure 5B:
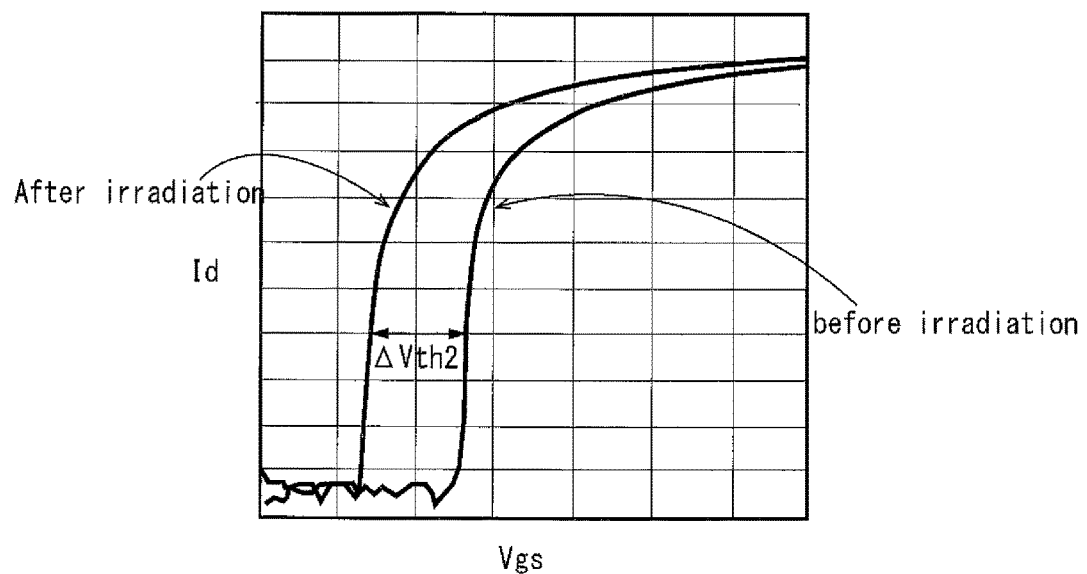
FIG. 5B illustrates the relationship between the gate-source voltage Vgs and the drain current Id before X-ray irradiation, and that after X-ray irradiation, in a conventional configuration in which an organic film exists above a TFT.

FIG. 5A illustrates the relationship between the gate-source voltage Vgs and the drain current Id before the X-ray irradiation, and that after the X-ray irradiation, in the configuration of the present embodiment in which the organic film 43 does not exist above the TFT 14. Further, FIG. 5B illustrates the relationship between the gate-source voltage Vgs and the drain current Id before the X-ray irradiation, and that after the X-ray irradiation, in a conventional configuration in which an organic film exists above the TFT. The gate-source voltage Vgs at which the drain current Id abruptly increases in FIGS. 5A and 5B is a threshold voltage of the TFT 14.

As illustrated in FIG. 5B, in the conventional configuration in which an organic film exists above the TFT, a shift ΔVth2 occurs between the threshold voltage of the TFT before the X-ray irradiation and that after the X-ray irradiation. On the other hand, as illustrated in FIG. 5A, in the configuration of the present embodiment as well, in which the organic film 43 does not exist above the TFT 14, a shift ΔVth1 occurs between the threshold voltage of the TFT 14 before the X-ray irradiation and that after the X-ray irradiation. The shift ΔVth1 of the threshold voltage, however, is small, as compared with the shift ΔVth2 of the threshold voltage in the conventional configuration in which the organic film is provided above the TFT; the shift ΔVth1 is about 0.5 time the shift ΔVth2. The present embodiment, therefore, makes it possible to reduce the amount of the shift of the threshold voltage of the TFT 14 caused by the X-ray irradiation.

Referring to FIG. 1 again, the following describes the configuration of the control unit 20. The control unit 20 includes the gate control part 20A, the signal reading part 20B, an image processing part 20C, the voltage control part 20D, and a timing control part 20E.

As illustrated in FIG. 2, a plurality of the gate lines 11 are connected to the gate control part 20A. The gate control part 20A applies a predetermined gate voltage, through the gate lines 11, to the TFTs 14 that are connected to the gate lines 11.

As illustrated in FIG. 2, a plurality of the data lines 12 are connected to the signal reading part 20B. Through the respective data lines 12, the signal reading part 20B reads out data signals corresponding to charges obtained by conversion by the photodiodes 15 that the pixels 13 include. The signal reading part 20B generates image signals based on the data signals, and outputs the same to the image processing part 20C.

The image processing part 20C generates an X-ray image signal based on the image signals output from the reading part 20B.

The voltage control part 20D is connected to the bias lines 16. The voltage control part 20D applies a predetermined bias voltage to the bias lines 16. This allows a bias voltage to be applied to the photodiodes 15 through the electrodes 44 connected to the bias lines 16.

The timing control part 20E controls timings of operations of the gate control part 20A, the signal reading part 20B, and the voltage control part 20D.

The gate control part 20A selects one gate line 11 from among a plurality of the gate lines 11, based on the control signal from the timing control part 20E. The gate control part 20A applies a predetermined gate voltage, through the selected gate line 11, to the TFTs 14 that are connected to the selected gate line 11.

The signal reading part 20B selects one data line 12 from among a plurality of the data lines 12 based on the control signal from the timing control part 20E. Through the selected data line 12, the signal reading part 20B reads out a data signal corresponding to charges obtained by conversion by the photodiode 15 in the pixel 13. The pixel 13 from which a data signal is read out is connected to the data line 12 selected by the signal reading part 20B, and is connected to the gate line 11 selected by the gate control part 20A.

The timing control part 20E, for example, outputs a control signal to the voltage control part 20D when X-ray is emitted from the X-ray source 30. Based on this control signal, the voltage control part 20D applies a predetermined bias voltage to the electrode 44.

(Operation of X-ray Imaging Device 1)

First, X-ray is emitted by the X-ray source 30. Here, the timing control part 20E outputs a control signal to the voltage control part 20D. More specifically, for example, a signal that indicates that X-ray is emitted from the X-ray source 30 is output from the control device that controls operations of the X-ray source 30, to the timing control part 20E. When this signal is input to the timing control part 20E, the timing control part 20E outputs the control signal to the voltage control part 20D. The voltage control part 20D applies a bias voltage to the bias line 16 based on the control signal from the timing control part 20E.

The X-ray emitted from the X-ray source 30 passes through the subject S, and becomes incident on the scintillator 10A. The X-ray incident on the scintillator 10A is converted to scintillation light, and the scintillation light becomes incident on the imaging panel 10.

When the scintillation light becomes incident on the photodiode 15 provided in each pixel 13 in the imaging panel 10, the scintillation light is converted by the photodiode 15 into charges corresponding to the amount of the scintillation light.

A data signal corresponding to the charges obtained by conversion by the photodiode 15 is read out by the signal reading part 20B through the data line 12 when the TFT 14 is caused to be in an ON state in response to a gate voltage (positive voltage) that is output from the gate control part 20A through the gate line 11. An X-ray image corresponding to the data signal thus read out is generated by the image processing part 20C.

(Method for Producing Imaging Panel 10)

Next, the following describes a method for producing the imaging panel 10. FIGS. 6 to 12 are cross-sectional views illustrating the pixel 13 in each step of the method for producing the imaging panel 10.

Figure 6:
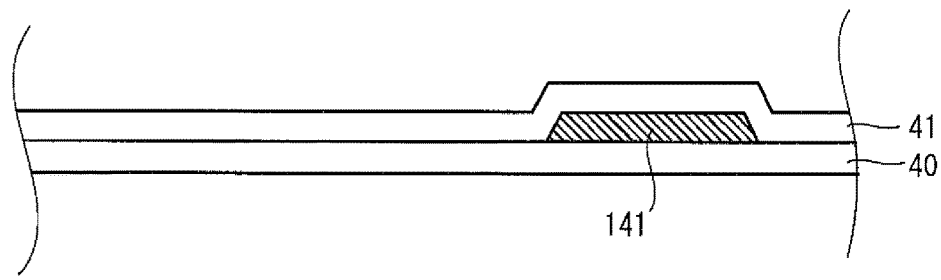
FIG. 6 is a cross-sectional view illustrating a step for producing the gate electrode and the gate insulating film illustrated in FIG. 4.

As illustrated in FIG. 6, a metal film is formed on the substrate 40, which is obtained by laminating aluminum and titanium by sputtering or the like. Then, this metal film is patterned by photolithography, whereby the gate electrode 141 is formed. This metal film has a thickness of, for example, 300 nm.

Next, the gate insulating film 41 made of silicon oxide ($SiO_x$), silicon nitride ($SiN_x$), or the like is formed on the substrate 40 by plasma CVD, sputtering, or the like, so as to cover the gate electrode 141. The gate insulating film 41 has a thickness of, for example, 20 to 150 nm.

Figure 7:
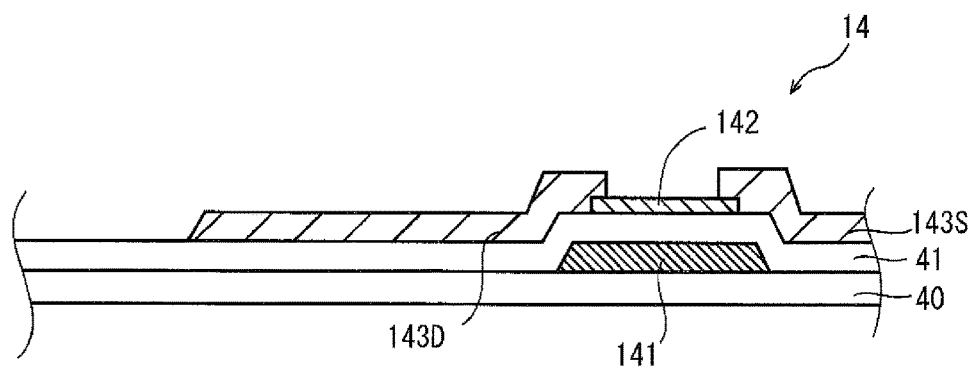
FIG. 7 is a cross-sectional view illustrating a step for producing the oxide semiconductor layer, the source electrode, and the drain electrode illustrated in FIG. 4.

Subsequently, as illustrated in FIG. 7, a film of oxide semiconductor containing indium (In), gallium (Ga), and zinc (Zn) is formed on the gate insulating film 41 by, for example, sputtering, and the oxide semiconductor is patterned by photolithography, whereby the oxide semiconductor layer 142 is formed. After the oxide semiconductor layer 142 is formed, it may be subjected to heat treatment in an atmosphere containing oxygen (for example, in the ambient atmosphere) at a high temperature (for example, at 350° C. or higher). In this case, oxygen defects in the oxide semiconductor layer 142 can be decreased. The oxide semiconductor layer 142 has a thickness of, for example, 5 to 100 nm.

Next, for example, a metal film containing aluminum is formed on the gate insulating film 41, and on the oxide semiconductor layer 142, by sputtering or the like. Then, this metal film is patterned by photolithography, and is subjected to dry etching, whereby the source electrode 143S, the data line 12, and the drain electrode 143D are formed. Thereby, the bottom gate type TFT 14 is formed. The thickness of the source electrode 143S and the drain electrode 143D is, for example, 50 to 500 nm.

Figure 8:
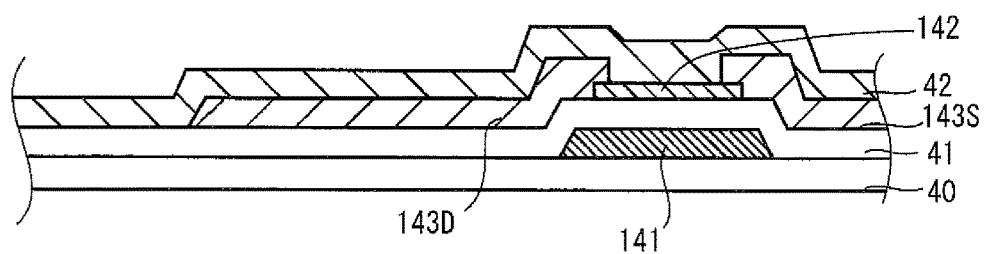
FIG. 8 is a cross-sectional view illustrating a step for producing the interlayer insulating film illustrated in FIG. 4.
Figure 9:
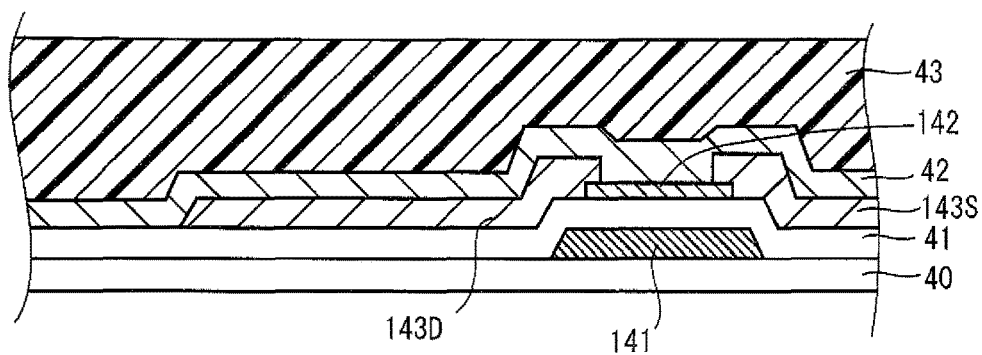
FIG. 9 is a cross-sectional view illustrating an intermediate process in a step for producing the organic film illustrated in FIG. 4.

Next, as illustrated in FIG. 8, the interlayer insulating film 42 made of silicon oxide ($SiO_2$) or silicon nitride (SiN) is formed by, for example, plasma CVD, on the source electrode 143S and the drain electrode 143D. Subsequently, as illustrated in FIG. 9, the organic film 43 containing an organic resin such as polyimide is formed on the interlayer insulating film 42 by plasma CVD. In the present embodiment, the organic film 43 has a thickness of, for example, 2 to 3 μm.

Figure 10:
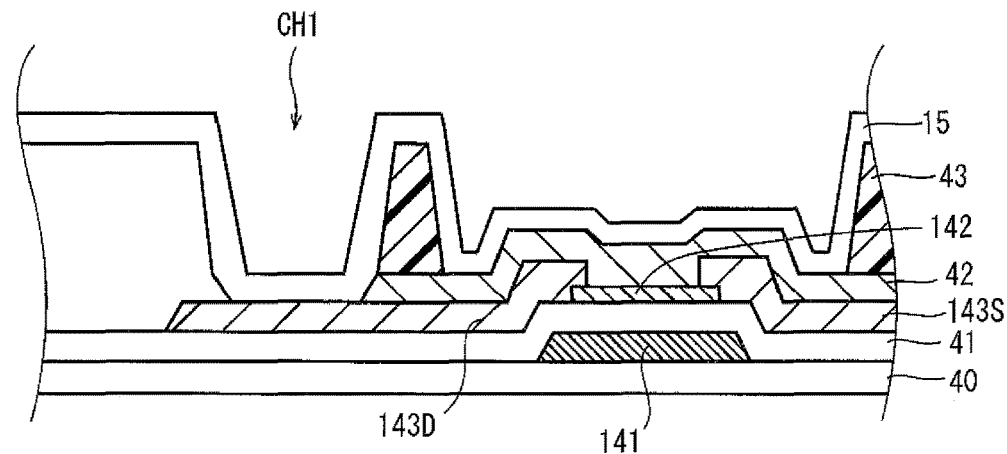
FIG. 10 is a cross-sectional view illustrating a step for producing the photodiode illustrated in FIG. 4.

After the organic film 43 is formed, as illustrated in FIG. 10, the film is patterned by photolithography, whereby a portion of the organic film 43 existing above the TFT 14 is removed, and at the same time, a contact hole CH1 is formed on a part of the drain electrode 143D. Then, an n-type amorphous silicon layer, an intrinsic amorphous silicon layer, and a p-type amorphous silicon layer are formed in this order on the organic film 43 by sputtering or the like. Then, patterning by photolithography is performed, followed by dry etching, whereby the photodiode 15 is formed. This causes the photodiode 15 and the drain electrode 143D to be connected via the contact hole CH1.

Figure 11:
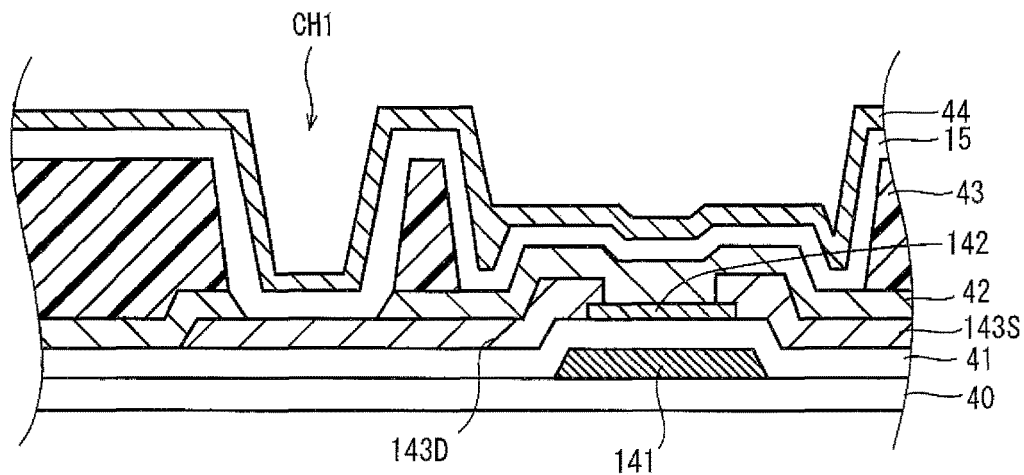
FIG. 11 is a cross-sectional view illustrating a step for producing the upper electrode illustrated in FIG. 4.

Subsequently, as illustrated in FIG. 11, for example, a film of indium zinc oxide (IZO) is formed by sputtering or the like on the photodiode 15, and the film is patterned by photolithography, whereby the electrode 44 is formed.

Figure 12:
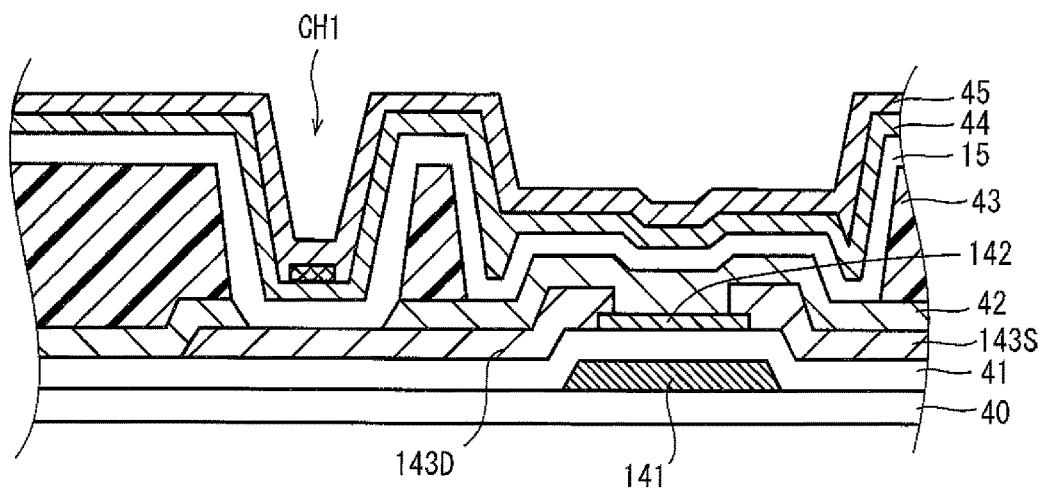
FIG. 12 is a cross-sectional view illustrating a pixel in an imaging panel in Embodiment 2, taken along line A-A in FIG. 3.

Next, as illustrated in FIG. 12, for example, a metal film is formed on the electrode 44 by sputtering or the like, the metal film being obtained by laminating indium zinc oxide (IZO) and molybdenum (Mo). The film is patterned by photolithography, whereby the bias line 16 is formed. Thereafter, a film of silicon oxide ($SiO_2$) or silicon nitride (SiN) is formed by plasma CVD or the like on the electrode 44 and the bias line 16, whereby the protection film 45 is formed.

[Embodiment 2]

The imaging panel in Embodiment 1 has a structure in which the organic film 43 does not exist above the TFT 14. In an imaging panel in Embodiment 2, the organic film 43 exists above the TFT 14, but in one pixel area, an area where the organic film 43 does not exist exists, other than an area where the contact hole CH1 is provided.

The schematic diagram of the X-ray imaging device of the present embodiment is the same as the schematic diagram in FIG. 1, and the schematic diagram illustrating the imaging panel of the present embodiment is the same as the schematic diagram in FIG. 2. The plan view illustrating the pixel of the imaging panel is the same as the plan view in FIG. 3.

Figure 13:
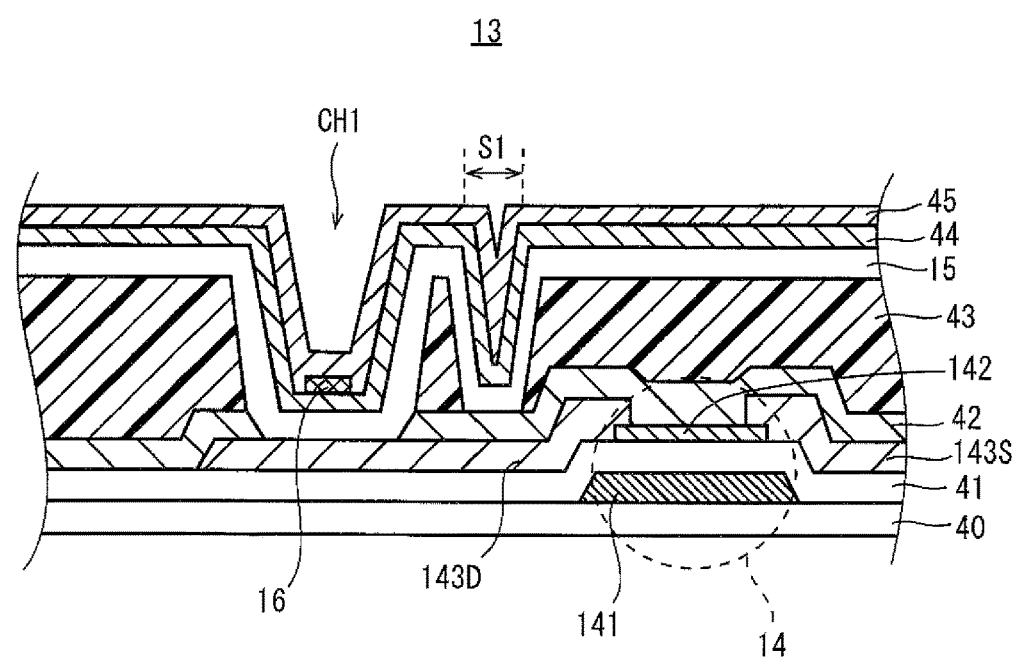
FIG. 13 is a cross-sectional view illustrating a pixel in the imaging panel in Embodiment 2, taken along line A-A in FIG. 3.

FIG. 13 is a cross-sectional view illustrating a pixel in an imaging panel in Embodiment 2, taken along line A-A in FIG. 3. As illustrated in FIG. 13, an organic film 43 exists above the TFT 14, between the interlayer insulating film 42 and the photodiode 15. In an area S1 in the vicinity of the TFT 14, however, the organic film 43 does not exist.

In one pixel area, an area where the organic film 43 does not exist exists, other than the area where the contact hole CH1 is provided. With this configuration, water or hydrogen in the organic film 43 can be released through this area. This makes it possible to prevent positive charges of water or hydrogen in the organic film 43 from being captured by the defect levels formed in the interlayer insulating film 42 and the gate insulating film 41 during the X-ray irradiation, thereby reducing the amount of shift of the threshold voltage of the TFT 14 caused by the X-ray irradiation. In order to release water or hydrogen in the organic film 43 through the area where the organic film 43 does not exist so as to decrease the amount of shift of the threshold voltage of the TFT 14, the area S1 where the organic film 43 does not exist is preferably close to the TFT 14.

The area where the organic film 43 does not exist, other than the area where the contact hole CH1 is provided, does not have to be close to the TFT 14; the area may be anywhere as long as it is provided in one pixel area. Further, the area where the organic film 43 does not exist, other than the area where the contact hole CH1 is provided, does not have to be only one, but a plurality of the same may be provided.

Figure 14:
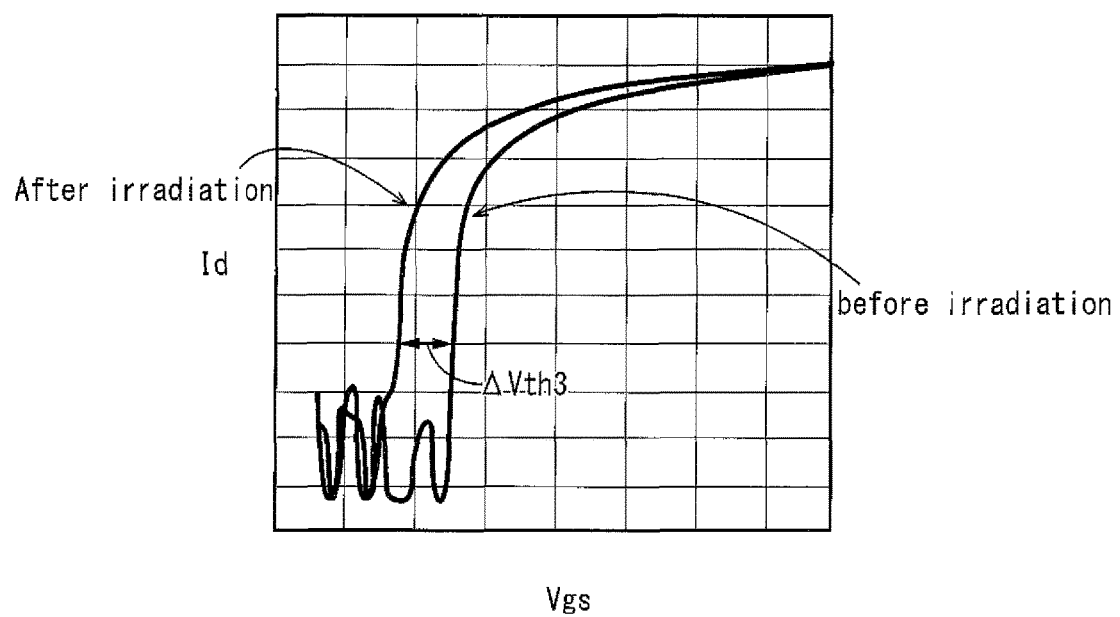
FIG. 14 illustrates the relationship between the gate-source voltage Vgs and the drain current Id before X-ray irradiation, and that after X-ray irradiation, in a configuration in which the organic film does not exist in a layer at an upper position with respect to TFTs, in the vicinity of the TFTs.

FIG. 14 illustrates the relationship between the gate-source voltage Vgs and the drain current Id before the X-ray irradiation, and that after the X-ray irradiation, in the configuration of the present embodiment in which the organic film 43 does not exist in an area S1 in the vicinity of the TFT 14. In the configuration of the present embodiment as well, a shift ΔVth3 between the threshold voltage of the TFT 14 before the X-ray irradiation and that after the X-ray irradiation occurs. This shift ΔVth3 of the threshold voltage, however, is small as compared with the shift ΔVth2 (see FIG. 5B) of the threshold voltage in the conventional configuration in which the organic film 43 is provided throughout one pixel area other than the area where the contact hole CH1 is provided; the shift ΔVth3 is about 0.6 time the shift ΔVth2.

In other words, in the configuration of the present embodiment as well, in which the organic film 43 exists above the TFT 14, but an area where the organic film 43 does not exist exists in one pixel area, other than the area where the contact hole CH1 is provided, the amount of shift of the threshold voltage of the TFT 14 caused by the X-ray irradiation can be decreased.

Regarding the method for producing the imaging panel according to Embodiment 2, the following is the only difference from the method for producing the imaging panel according to Embodiment 1 (see FIGS. 6 to 12): a portion of the organic film 43 removed after the organic film 43 is formed on the interlayer insulating film 42 is not the portion above the TFT 14, but the portion in the area S1 in the vicinity of the TFT 14. Regarding the other points, the method according to Embodiment 2 is identical to the method for producing the imaging panel according to Embodiment 1.

[Embodiment 3]

The imaging panel according to Embodiment 1 described above has such a configuration that an organic film is not provided above the TFTs 14, in the configuration in which only one layer of the organic film is provided. In an imaging panel according to Embodiment 3, in a case where two layers of the organic films are laminated, at least one layer of the organic film is not provided above the TFT 14.

The schematic diagram of the X-ray imaging device of the present embodiment is the same as the schematic diagram in FIG. 1, and the schematic diagram illustrating the imaging panel of the present embodiment is the same as the schematic diagram in FIG. 2. The plan view illustrating the pixel of the imaging panel is the same as the plan view in FIG. 3.

Figure 15:
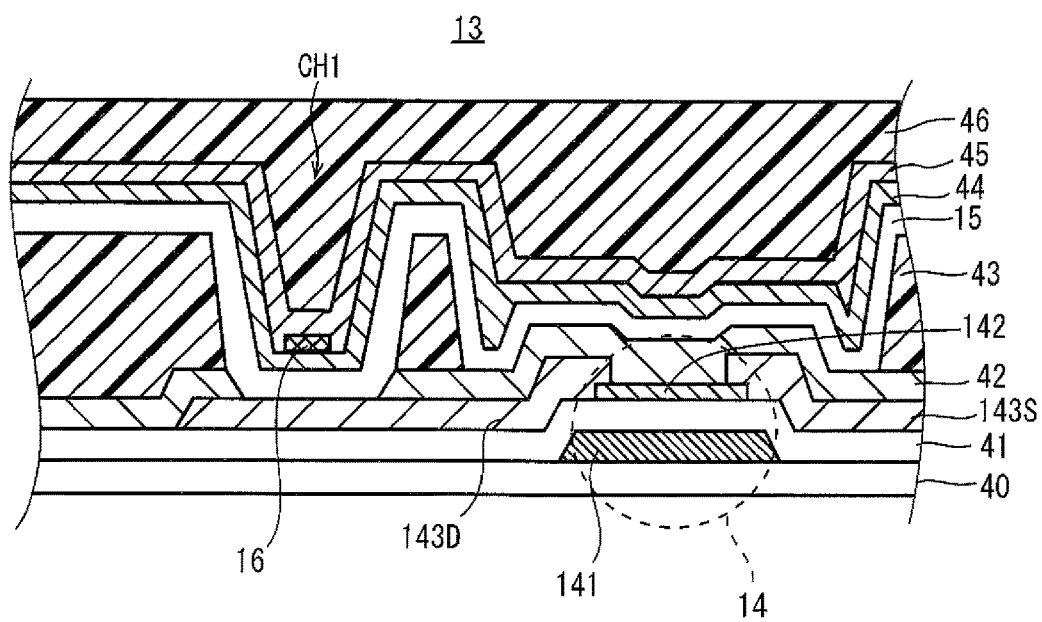
FIG. 15 is a cross-sectional view illustrating a pixel in an imaging panel in Embodiment 3, taken along line A-A in FIG. 3.

FIG. 15 is a cross-sectional view illustrating a pixel in an imaging panel in Embodiment 3, taken along line A-A in FIG. 3. In the imaging panel according to Embodiment 3, as illustrated in FIG. 15, an organic film 46 is provided on a protection film 45. As a material for forming the organic film 46, for example, an organic resin such as polyimide can be used. Here, the organic film 43 is referred to as the first organic film 43, and the organic film 46 is referred to as the second organic film 46.

The second organic film 46 functions as a flattening film for flattening the surface.

In the imaging panel illustrated in FIG. 15, like the imaging panel in Embodiment 1, the first organic film 43 is not provided above the TFT 14. In other words, the second organic film 46 is provided above the TFT 14, but the first organic film 43 is not provided. In this configuration as well, an effect of reducing the shift of the threshold voltage of the TFT 14 caused by the X-ray irradiation can be achieved, as compared with the configuration in which both of the first organic film 43 and the second organic film 46 are provided above the TFT 14.

Regarding the method for producing the imaging panel illustrated in FIG. 15, the steps thereof up to the step of forming the protection film 45 are identical to the corresponding steps of the method for producing the imaging panel in Embodiment 1 (see FIGS. 6 to 12). After the protection film 45 is formed, the second organic film 46 containing an organic resin such as polyimide is formed by plasma CVD.

Figure 16:
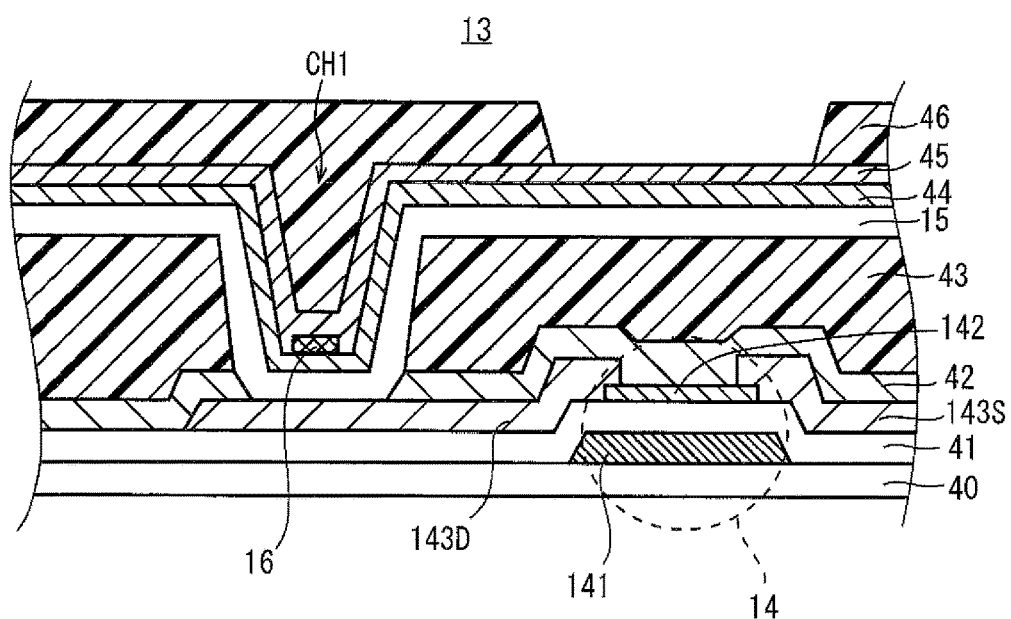
FIG. 16 is a cross-sectional view illustrating a pixel in another configuration of the imaging panel in Embodiment 3, taken along line A-A in FIG. 3.

FIG. 16 is a cross-sectional view illustrating a pixel in another configuration of the imaging panel according to Embodiment 3, taken along line A-A in FIG. 3.

In the imaging panel illustrated in FIG. 16, the second organic film 46 is provided on the protection film 45. Above the TFT 14, however, the second organic film 46 is not provided. On the other hand, the first organic film 43 is provided above the TFT 14. In other words, the first organic film 43 is provided above the TFT 14, whereas the second organic film 46 is not provided above the TFT 14. In this configuration as well, the effect of reducing the shift of the threshold voltage of the TFT 14 caused by the X-ray irradiation is achieved, as compared with the configuration in which both of the first organic film 43 and the second organic film 46 are provided above the TFT 14.

In comparison between the configuration illustrated in FIG. 15 and the configuration illustrated in FIG. 16, the configuration illustrated in FIG. 15 in which the first organic film 43 closer to the TFT 14 is not provided above the TFT 14 has a greater effect of reducing the shift of the threshold voltage of the TFT 14 caused by the X-ray irradiation.

Regarding the method for producing the imaging panel illustrated in FIG. 16, the steps thereof up to the step of forming the protection film 45 are approximately identical to the corresponding steps of the method for producing the imaging panel in Embodiment 1 (see FIGS. 6 to 12). It should be noted, however, that after the first organic film 43 is formed, the organic film 43 is patterned by photolithography so that a part of the first organic film 43 existing above the TFT 14 is removed in the case of the method for producing the imaging panel according to Embodiment 1 (see FIG. 10), whereas a part of the first organic film 43 existing above the TFT 14 is not removed in the case of the method for producing the imaging panel illustrated in FIG. 16.

Figure 17:
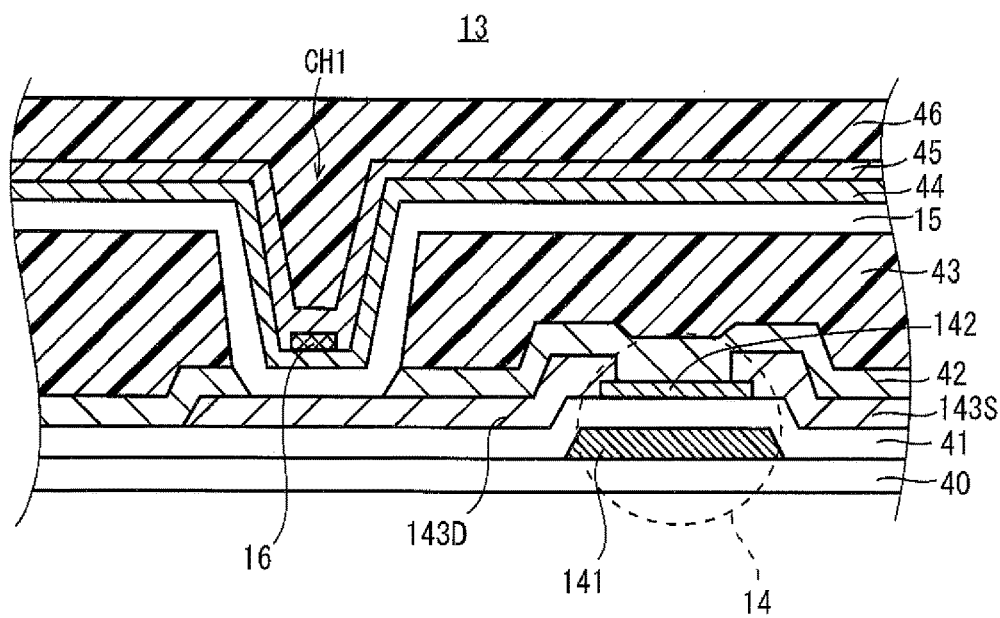
FIG. 17 is a cross-sectional view illustrating an intermediate process in a step for producing the second organic film, in the imaging panel producing method illustrated in FIG. 16.
Figure 18:
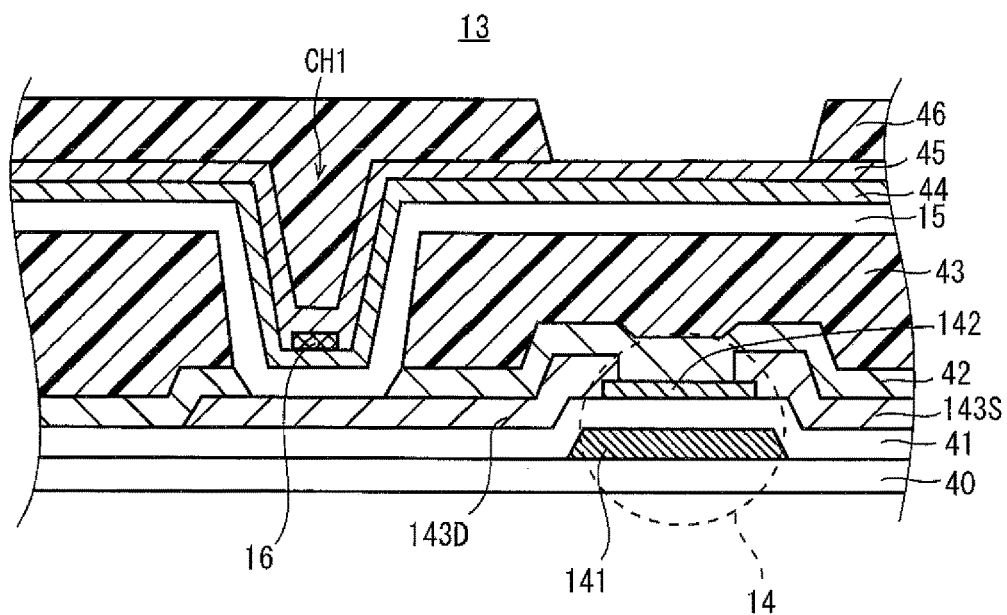
FIG. 18 is a cross-sectional view illustrating the final state in a step for producing the second organic film, in the imaging panel producing method illustrated in FIG. 16.

After the protection film 45 is formed, the second organic film 46 containing an organic resin such as polyimide is formed by plasma CVD as illustrated in FIG. 17. Then, as illustrated in FIG. 18, patterning by photolithography is performed so that the second organic film 46 is removed from above the TFT 14.

[Embodiment 4]

In the above-described imaging panel according to Embodiment 2, in the configuration in which one layer of an organic film is provided, the organic film exists above the TFT 14, but in one pixel area, an area where the organic film does not exist exists, other than the area where the contact hole CH1 is provided. In an imaging panel according to Embodiment 4, in a case where two layers of organic films are laminated, the two layers of the organic films exist above the TFT 14, but in one pixel area, an area where at least one layer of the organic film does not exist exists, other than the area where the contact hole CH1 is provided.

The schematic diagram of the X-ray imaging device of the present embodiment is the same as the schematic diagram in FIG. 1, and the schematic diagram illustrating the imaging panel of the present embodiment is the same as the schematic diagram in FIG. 2. The plan view illustrating the pixel of the imaging panel is the same as the plan view in FIG. 3.

Figure 19:
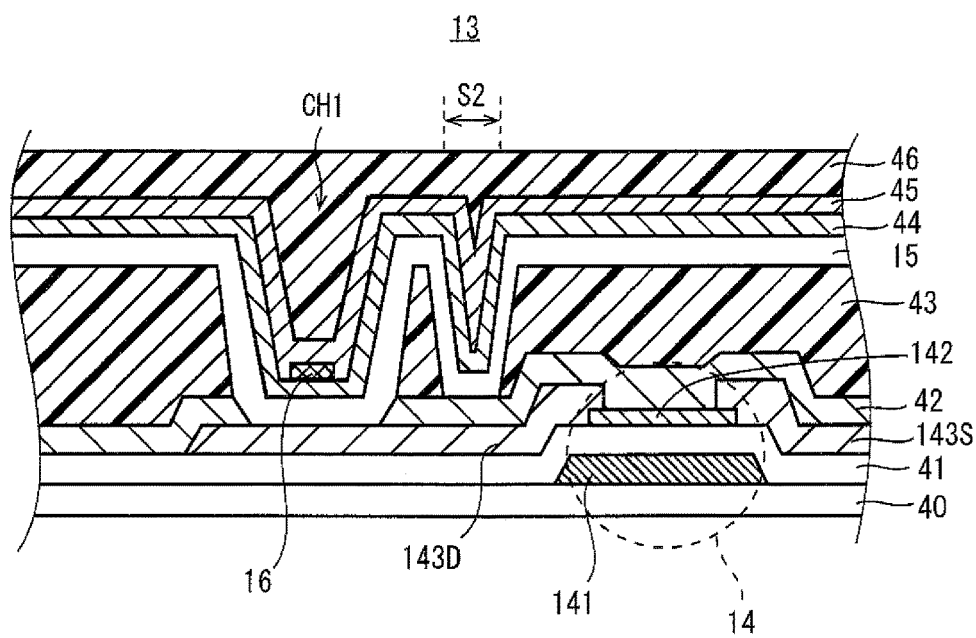
FIG. 19 is a cross-sectional view illustrating a pixel in an imaging panel in Embodiment 4, taken along line A-A in FIG. 3.

FIG. 19 is a cross-sectional view illustrating a pixel in an imaging panel in Embodiment 4, taken along line A-A in FIG. 3. In the imaging panel according to Embodiment 4 as well, an organic film 46 is provided on a protection film 45. As a material for forming the organic film 46, for example, an organic resin such as polyimide can be used. The organic film 43 is referred to as the first organic film 43, and the organic film 46 is referred to as the second organic film 46, as is the case with Embodiment 3.

As illustrated in FIG. 19, the first organic film 43 and the second organic film 46 exist above the TFT 14. In an area S2 in the vicinity of the TFT 14, however, the second organic film 46 exists, but the first organic film 43 does not exist. In this configuration as well, the effect of reducing the shift of the threshold voltage of the TFT 14 caused by the X-ray irradiation is achieved.

As described in the description of Embodiment 2, the area S2 where the first organic film 43 is not provided is preferably close to the TFT 14. The area where the first organic film 43 is not provided, however, does not have to be in the vicinity of the TFT 14, and the same may be provided in anywhere in one pixel area. Further, not one but a plurality of areas where the first organic film 43 is not provided may be provided, other than the area where the contact hole CH1 is provided.

Regarding the method for producing the imaging panel illustrated in FIG. 19, the steps thereof up to the step of forming the protection film 45 are identical to the corresponding steps of the method for producing the imaging panel in Embodiment 2. After the protection film 45 is formed, the second organic film 46 containing an organic resin such as polyimide is formed by plasma CVD.

Figure 20:
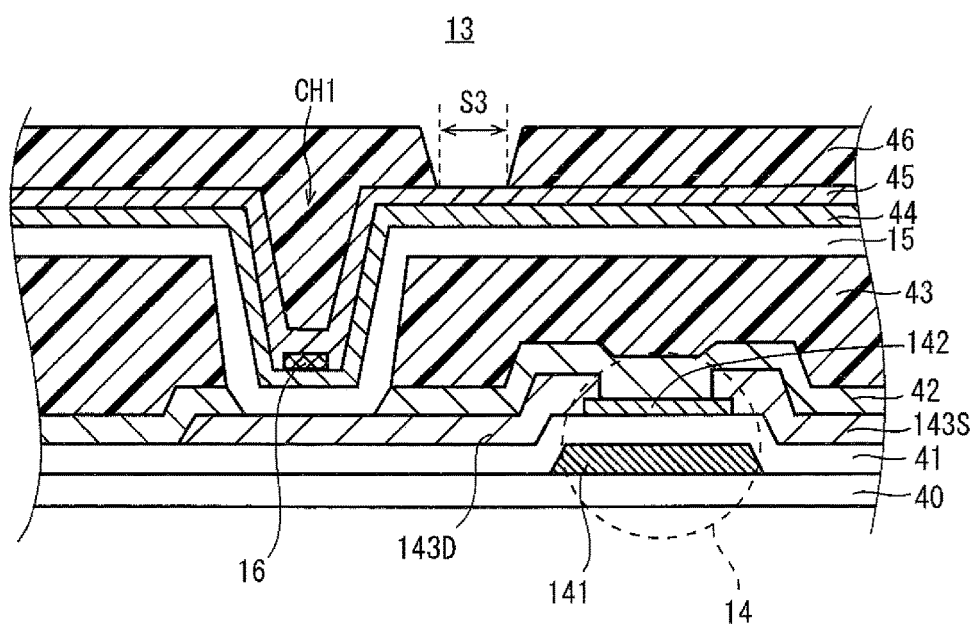
FIG. 20 is a cross-sectional view illustrating a pixel in another configuration of the imaging panel in Embodiment 4, taken along line A-A in FIG. 3.

FIG. 20 is a cross-sectional view illustrating a pixel in another configuration of the imaging panel according to Embodiment 4, taken along line A-A in FIG. 3.

In the imaging panel illustrated in FIG. 20 as well, the second organic film 46 is provided on the protection film 45. As illustrated in FIG. 20, the first organic film 43 and the second organic film 46 exist above the TFT 14. In the area S3 in the vicinity of the TFT 14, however, the first organic film 43 exists, but the second organic film 46 does not exist. In this configuration as well, the effect of reducing the shift of the threshold voltage of the TFT 14 caused by the X-ray irradiation can be achieved.

The area S3 where the second organic film 46 is not provided is preferably close to the TFT 14. The area where the second organic film 46 is not provided, however, does not have to be in the vicinity of the TFT 14, and the same may be provided in anywhere in one pixel area. Further, not one but a plurality of areas where the second organic film 46 is not provided may be provided.

The method for producing the imaging panel illustrated in FIG. 20 is approximately identical to the imaging panel producing method illustrated in FIG. 16. It should be noted, however, that after the second organic film 46 is formed on the protection film 45, the second organic film 46 is patterned by photolithography so that a part of the second organic film 46 existing above the TFT 14 is removed in the imaging panel producing method illustrated in FIG. 16; on the other hand, after the second organic film 46 is formed on the protection film 45, the second organic film 46 is patterned by photolithography so that a part of the second organic film 46 in the area S3 in the vicinity of the TFT 14 is removed in the imaging panel producing method illustrated in FIG. 20

[Embodiment 5]

In the above-described imaging panels according to Embodiments 1 to 4, the oxide semiconductor layer 142 contains an oxide semiconductor that contains indium (In), gallium (Ga), and zinc (Zn) at a predetermined ratio. In an imaging panel according to Embodiment 5, the oxide semiconductor layer 142 contains an oxide semiconductor that has a higher electronic mobility than that of the oxide semiconductor containing In, Ga, and Zn at a predetermined ratio.

Examples of the oxide semiconductor that has a higher electronic mobility than that of the oxide semiconductor containing In, Ga, and Zn at a predetermined ratio include an oxide semiconductor that contains at least one or more materials of In, Ga, Zn, and tin (Sn), which is, for example, an oxide semiconductor that contains In, Sn, and Zn at a predetermined ratio. Alternatively, the oxide semiconductor may be an oxide semiconductor that contains In, Ga, and Zn at a composition ratio of In, Ga, and Zn adjusted so that the electronic mobility increases.

As the electronic mobility of the oxide semiconductor contained in the oxide semiconductor layer 142 increases, the amount of shift of the threshold voltage of the TFT 14 caused by the X-ray irradiation increases. Therefore, with a configuration in which an area where an organic film does not exist in a layer at an upper position with respect to the TFT 14 exists in one pixel area, the effect of reducing the shift of the threshold voltage of the TFT 14 caused by the X-ray irradiation increases.

The present invention is not limited to the above-described embodiments. For example, the configuration of the oxide semiconductor layer 142 is not limited to the above-described configurations.

The TFT 14 is not limited to the bottom gate type TFT, but may be a top gate type TFT.

In Embodiment 3, the configuration may be such that neither of the first organic film 43 and the second organic film 46 exists above the TFT 14. Further, in Embodiment 3, three or more layers of the organic films may be laminated. In this case as well, the configuration may be such that at least one layer of the organic film does not exist above the TFT 14.

In Embodiment 4, the configuration may be such that neither the first organic film 43 nor the second organic film 46 exists in the area S2 in FIG. 19, or may be such that neither the second organic film 46 nor the first organic film 43 exists in the area S3 in FIG. 20. Further, in Embodiment 4, three or more layers of the organic films may be laminated. In this case as well, the configuration may be such that, in one pixel area, an area where at least one layer of the organic film does not exist exists in a layer at an upper position with respect to the TFT 14, other than the area where the contact hole CH1 is provided.

DESCRIPTION OF REFERENCE NUMERALS

1: X-ray imaging device
10: imaging panel
10A: scintillator
11: gate line
12: data line
13: pixel
14: thin film transistor (TFT)
15: photodiode
16: bias line
20: control unit
20A: gate control part
20B: signal readout part
20C: image processing part
20D: voltage control part
20E: timing control part
30: X-ray light source
41: gate insulating film
42: interlayer insulating film 43: organic film (first organic film)
44: upper electrode
45: protection film
46: organic film (second organic film)
141: gate electrode
142: oxide semiconductor layer
143S: source electrode
143D: drain electrode

The invention claimed is:

1. An imaging panel having a plurality of pixels, for picking up scintillation light obtained by converting X-ray projected from an X-ray source, with use of a scintillator, the imaging panel comprising:
   conversion elements that are provided at the pixels, respectively, for receiving the scintillation light and converting the same into charges;
   thin film transistors that are provided at the pixels, respectively, for reading the charges obtained through the conversion by the conversion elements; and
   an organic film provided at an upper or lower position with respect to the conversion elements,
   wherein each thin film transistor includes:
      an oxide semiconductor layer;
      a gate terminal;
      a source terminal formed on a part of the oxide semiconductor layer; and
      a drain terminal formed on a part of the oxide semiconductor layer,
   in one pixel area of the pixels, an area where the organic film is not provided exists in a layer at an upper position with respect to the thin film transistors, other than an area where a contact hole for connecting the conversion element and the drain terminal is provided, and
   the organic film does not overlap with the thin film transistors in a planar view.

2. An X-ray imaging device comprising:
   the imaging panel according to claim 1;
   an X-ray source that projects X-ray; and
   a control unit that reads out a signal corresponding to charges obtained through conversion by the conversion elements by controlling a gate voltage of the thin film transistors.

3. An imaging panel having a plurality of pixels, for picking up scintillation light obtained by converting X-ray projected from an X-ray source, with use of a scintillator, the imaging panel comprising:
   conversion elements that are provided at the pixels, respectively, for receiving the scintillation light and converting the same into charges;
   thin film transistors that are provided at the pixels, respectively, for reading the charges obtained through the conversion by the conversion elements; and
   an organic film provided at an upper or lower position with respect to the conversion elements,
   wherein each thin film transistor includes:
      an oxide semiconductor layer;
      a gate terminal;
      a source terminal formed on a part of the oxide semiconductor layer; and
      a drain terminal formed on a part of the oxide semiconductor layer,
   in one pixel area of the pixels, an area where the organic film exists in a layer at an upper position with respect to the thin film transistors, other than an area where a contact hole for connecting the conversion element and the drain terminal is provided,
   wherein the organic film includes a first organic film, and a second organic film that is provided at an upper position with respect to the first organic film,
   in one pixel area of the pixels, an area where at least one of the first organic film and the second organic film is not provided exists in a layer at an upper position with respect to the thin film transistors, other than the area where the contact hole is provided, and
   at least one of the first organic film and the second organic film does not overlap with the thin film transistors in a planar view.

* * * * *